United States Patent
Lee et al.

(10) Patent No.: US 9,210,764 B2
(45) Date of Patent: Dec. 8, 2015

(54) ORGANIC LIGHT EMITTING DIODE DEVICE AND METHOD OF MANUFACTURING THE SAME

(71) Applicants: Young-Sahn Lee, Yongin (KR);
Young-Mi Cho, Yongin (KR);
Kyung-Chan Chae, Yongin (KR)

(72) Inventors: Young-Sahn Lee, Yongin (KR);
Young-Mi Cho, Yongin (KR);
Kyung-Chan Chae, Yongin (KR)

(73) Assignee: SAMSUNG DISPLAY CO., LTD.,
Yongin, Gyeonggi-Do (KR)

( * ) Notice: Subject to any disclaimer, the term of this patent is extended or adjusted under 35 U.S.C. 154(b) by 116 days.

(21) Appl. No.: 13/771,512

(22) Filed: Feb. 20, 2013

(65) Prior Publication Data
US 2014/0049156 A1    Feb. 20, 2014

(30) Foreign Application Priority Data

Aug. 14, 2012    (KR) .................. 10-2012-0089139

(51) Int. Cl.
*H01L 51/52* (2006.01)
*H01L 51/54* (2006.01)
*H05B 33/12* (2006.01)
*H05B 33/10* (2006.01)

(52) U.S. Cl.
CPC ............ *H05B 33/12* (2013.01); *H01L 51/5253* (2013.01); *H05B 33/10* (2013.01); *H01L 51/5203* (2013.01)

(58) Field of Classification Search
CPC .... H05B 33/12; H05B 33/10; H01L 51/5253;
H01L 51/5203
See application file for complete search history.

(56) References Cited

U.S. PATENT DOCUMENTS

| | | | |
|---|---|---|---|
| 2003/0152801 A1 | 8/2003 | Liao et al. | |
| 2004/0090173 A1* | 5/2004 | Park et al. | 313/500 |
| 2006/0170341 A1* | 8/2006 | Su et al. | 313/512 |
| 2008/0018231 A1* | 1/2008 | Hirakata | 313/498 |
| 2010/0134426 A1* | 6/2010 | Lee et al. | 345/173 |
| 2010/0301742 A1* | 12/2010 | Moriwaki | 313/504 |

FOREIGN PATENT DOCUMENTS

| | | |
|---|---|---|
| JP | 2003-142253 A | 5/2003 |
| KR | 10-0770257 B1 | 10/2007 |
| KR | 10-1015848 B1 | 2/2011 |

OTHER PUBLICATIONS

English machine translation of JP 2003-142253 (Uchida).*

* cited by examiner

*Primary Examiner* — Donald Raleigh
(74) *Attorney, Agent, or Firm* — Lee & Morse, P.C.

(57) ABSTRACT

An organic light emitting diode device includes a first electrode, a light emitting member on the first electrode, a second electrode on the light emitting member, which second electrode includes a first material, a protective member on the second electrode, which the protective member includes a second material having a larger absolute value of a standard oxidation potential than that of the first material, and a thin film encapsulating layer on the protective member.

19 Claims, 7 Drawing Sheets

ORGANIC LIGHT EMITTING DIODE DEVICE AND METHOD OF MANUFACTURING THE SAME

CROSS REFERENCE TO RELATED APPLICATION

This application claims priority under 35 U.S.C. §119 to Korean Patent Application No. 10-2012-0089139 filed in the Korean Intellectual Property Office on Aug. 14, 2012, the entire contents of which are incorporated herein by reference.

BACKGROUND

In view of requests for a reduction in size and thickness of a monitor, a television, or the like, the replacement of a cathode ray tube (CRT) with a liquid crystal display (LCD) has been prompted. The liquid crystal display (LCD) uses a separate backlight as an emissive device, and may have a limit in terms of a response speed, a viewing angle, and the like. Accordingly, an organic light emitting diode device (OLED) display is being developed, in which a self-emissive layer is included.

SUMMARY

Embodiments may be realized by providing an organic light emitting diode device that includes a first electrode, a light emitting member disposed on the first electrode, a second electrode disposed on the light emitting member and including a first material, a protective member disposed on the second electrode and including a second material having a larger absolute value of a standard oxidation potential than that of the first material, and a thin film encapsulating layer disposed on the protective member.

The thin film encapsulating layer may include an inorganic layer and an organic layer. The thin film encapsulating layer may include at least one inorganic layer and at least one organic layer that are alternately stacked. The inorganic layer may include at least one of metal and metal oxide, and the organic layer may include a polymer.

The first material may include magnesium (Mg) or a magnesium alloy, and the second material may include lithium (Li), cesium (Cs), rubidium (Rb), potassium (K), barium (Ba), strontium (Sr), europium (Eu), radium (Ra), sodium (Na), lanthanum (La), or a combination thereof. The second material may include lithium (Li), strontium (Sr), europium (Eu), or a combination thereof.

The protective member may be in contact with the second electrode. The protective member may have a thickness of about 50 Å to about 1,000 Å. The protective member may cover the entire surface of the second electrode. The protective member may be disposed on at least one part of regions except a light emitting region. The protective member may be distributed on the second electrode in a form of a particle.

The organic light emitting diode device may further include a capping layer between the protective member and thin film encapsulating layer.

Embodiments may also be realized by providing a method of manufacturing an organic light emitting diode device that includes forming a first electrode, forming a light emitting member on the first electrode, forming a second electrode including a first material on the light emitting member, forming a protective member disposed on the second electrode and including a second material having a larger absolute value of a standard oxidation potential than that of the first material, and forming a thin film encapsulating layer on the protective member.

The forming the thin film encapsulating layer may include forming an inorganic layer and an organic layer alternately. The forming the inorganic layer may be performed by sputtering or a chemical vapor deposition (CVD).

The first material may include magnesium (Mg) or a magnesium alloy, and the second material may include lithium (Li), cesium (Cs), rubidium (Rb), potassium (K), barium (Ba), strontium (Sr), europium (Eu), radium (Ra), sodium (Na), lanthanum (La), or a combination thereof. The forming the protective member may include forming the second material by thermally evaporation on the entire surface of the second electrode.

The forming the protective member may include forming the second material on at least one part of regions except a light emitting region. The forming the protective member may include providing particles including the second material on one side of the second electrode. The method may further include forming a capping layer between forming the protective member and forming the thin film encapsulating layer.

DETAILED DESCRIPTION

Figure 1:
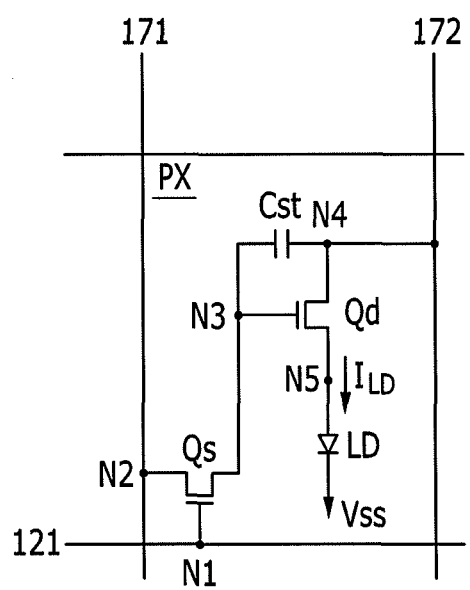
FIG. 1 is a view of an equivalent circuit of a unit pixel of an organic light emitting diode device, according to an exemplary embodiment.

The present disclosure will be described more fully hereinafter with reference to the accompanying drawings, in which exemplary embodiments of this disclosure are shown. This disclosure may, however, be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an organic light emitting diode device in accordance with an embodiment will be described.

FIG. 1 is a view of an equivalent circuit of a unit pixel of an organic light emitting diode device according to one embodiment.

Referring to FIG. 1, an organic light emitting diode device according to an exemplary embodiment may include a plurality of signal lines 121, 171, and 172, and a pixel (PX) connected thereto.

The signal lines include a scanning signal line 121 transferring a gate signal (or scan signal), a data line 171 transferring a data signal, a driving voltage line 172 transferring driving voltage, and the like. The scanning signal lines 121 are extended in a substantially row direction and are substantially parallel to each other. The data lines 171 are extended in a substantially column direction and are substantially parallel to each other. The driving voltage line 172 is shown extended in a substantially column direction, but may be extended in either a row direction or a column direction or formed in a net shape. The driving voltage lines 172 may be substantially parallel to each other.

The pixel (PX) includes a switching transistor (Qs), a driving transistor (Qd), a storage capacitor (Cst), and an organic light emitting element (LD).

The switching transistor (Qs) includes a control terminal connected to a node N1, an input terminal connected to a node N2, and an output terminal connected to a node N3. The control terminal of the switching transistor (Qs) at the node N1 is connected to the scanning signal line 121, the input terminal at the node N2 is connected to the data line 171, and the output terminal at the node N3 is connected to the driving transistor (Qd). The switching transistor (Qs) transfers the data signal received from the data line 171 to the driving transistor (Qd) in response to the scan signal received from the scanning signal line 121.

The driving transistor (Qd) also includes a control terminal corrected to the node N3, an input terminal connected to a node N4, and an output terminal connected to a node N5. The control terminal of the driving transistor (Qd) is connected to the switching transistor (Qs), the input terminal through the node N4 is connected to the driving voltage line 172, and the output terminal through the node N5 is connected to the organic light emitting element (LD). The driving transistor (Qd) flows output current ($I_{LD}$) having different intensity according to voltage applied between the control terminal and the node N5.

The capacitor (Cst) is connected between the node N3 connected to the control terminal of driving transistor (Qd) and the node N4 connected to the input terminal of driving transistor (Qd). The capacitor (Cst) charges data signal applied to the control terminal of driving transistor (Qd) and maintains the same even after the switching transistor (Qs) is turn off.

The organic light emitting element (LD), e.g., an organic light emitting diode (OLED), includes an anode connected to the output terminal of the driving transistor (Qd) through the node N5 and a cathode connected to a common voltage (Vss). The organic light emitting element (LD) displays an image by changing an intensity of emitted light according to the output current (ILD) of driving transistor (Qd). The organic light emitting element (LD) may include an organic material that emits any one or at least one color e.g., one of the three primary colors of red, green, and blue. The organic light emitting diode device displays a desired image by the spacious combination of the colors.

The switching transistor (Qs) and the driving transistor (Qd) are n-channel field effect transistors (FET), but at least one thereof may be a p-channel field effect transistor. The connection relationship of transistor (Qs, Qd), capacitor (Cst), and organic light emitting element (LD) may be changed.

Figure 2:
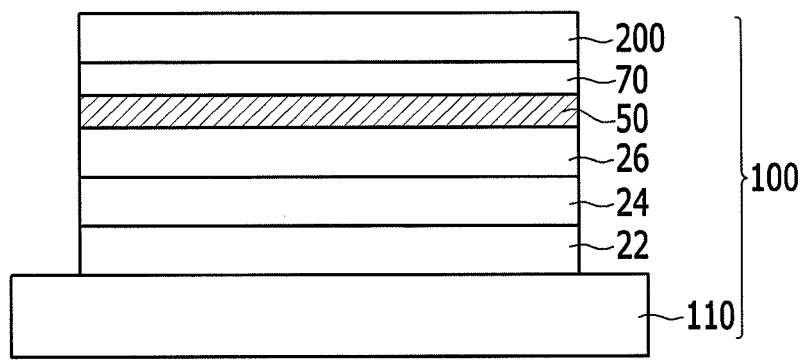
FIG. 2 is a cross-sectional view of an organic light emitting diode device of FIG. 1.

A structure of an organic light emitting diode device according to one embodiment is described referring to FIG. 2 along with FIG. 1.

FIG. 2 is a cross-sectional view of an organic light emitting diode device of FIG. 1.

The organic light emitting diode device 100 according to an exemplary embodiment may include a substrate 110, a plurality of signal lines (not shown), a switching transistor (not shown), and a driving transistor (not shown) formed on the substrate 110. A lower electrode 22 may be disposed on the substrate 110 to be connected to the driving transistor. A light emitting member 24 may be disposed on the lower electrode 22, and an upper electrode 26 may be disposed on the light emitting member 24. A protective member 50 may be disposed on the upper electrode 26, and a capping layer 70 may be disposed on the protective member 50. A thin film encapsulating layer 200 may be disposed on the capping layer 70.

The substrate 100 may be, e.g., a glass substrate, a silicon wafer, or a polymer substrate. The polymer substrate may be made of, e.g., polycarbonate, polymethyl methacrylate (PMMA), polyethylene terephthalate (PET), polyethylene naphthalate (PEN), polyamide, polyethersulfone (PES), or a combination thereof.

Each of the switching transistor (Qs) and the driving transistor (Qd) may include a semiconductor, a gate electrode connected to the control terminal thereof, a source electrode connected to the input terminal thereof, and a drain electrode connected to the output terminal thereof. The switching transistor (Qs) and the driving transistor (Qd) may have the various structures such as a bottom gate structure in which the gate electrode is disposed under the semiconductor, a top gate structure in which the gate electrode is disposed on the semiconductor, a bottom contact structure in which the lower surface of semiconductor is contacted with the source electrode and the drain electrode, a top contact structure in which the upper surface of semiconductor is contacted with the source electrode and the drain electrode, and the like.

One of lower electrode 22 and upper electrode 26 is a cathode, and the other is an anode. For example, the lower electrode 22 may be an anode, and the upper electrode 26 may be a cathode.

At least one of the lower electrode 22 and the upper electrode 26 is a transparent electrode. When the lower electrode 22 is a transparent electrode, light may be emitted through the substrate 110, which is bottom emission. When the upper electrode 26 is a transparent electrode, light may be emitted through the opposite side of substrate 110, which is top emission. When both the lower electrode 22 and the upper electrode 26 are transparent electrodes, light may be emitted toward both the side of substrate 110 and the opposite side of substrate 110.

The lower electrode 22 may be made of a transparent conductive oxide, e.g., indium tin oxide (ITO) or indium zinc oxide (IZO).

The upper electrode 26 may include, e.g., magnesium (Mg) or magnesium alloy. The magnesium alloy may include, e.g., magnesium-silver alloy (MgAg), a bi-layer of magnesium (Mg) layer and silver (Ag) layer, or the like, but is not limited thereto. The magnesium-silver alloy (MgAg) may be an alloy in which, e.g., magnesium (Mg) and silver (Ag) are co-deposited at about 10:1.

The light emitting member 24 may include an emission layer and an auxiliary layer.

The emission layer of the light emitting member 24 may be made of an organic material emitting one light among primary colors such as red, green, blue, and the like, or a mixture of an inorganic material with the organic material, for example, a polyfluorene derivative, a (poly)paraphenylenevinylene derivative, a polyphenylene derivative, a polyfluorene derivative, polyvinylcarbazole, a polythiophene derivative, or a compound prepared by doping these polymer materials with a perylene-based pigment, a cumarine-based pigment, a rothermine-based a pigment, rubrene, perylene, 9,10-diphenylanthracene, tetraphenylbutadiene, Nile red, coumarin, quinacridone, and the like. An organic light emitting diode device may display a desired image by a spacious combination of primary colors emitted by an emission layer therein.

The emission layer of the light emitting member 24 may emit a white light by combining three primary colors such as red, green, and blue. For example, the emission layer 30 may emit a white light by combining colors of neighboring subpixels or by combining laminated colors in a vertical direction.

The auxiliary layer may be positioned between the lower electrode 22 and the emission layer and/or between the upper electrode 26 and the emission layer, e.g., to improve luminous efficiency. The auxiliary layer may include, e.g., an electron transport layer (ETL) and a hole transport layer (HTL) for balancing between electrons and holes, an electron injection layer (EIL), a hole injection layer (HIL) for reinforcing injection of electrons and holes, and the like. It may include one or more layers selected therefrom.

A protective member 50 may be disposed on one surface of upper electrode 26 to, e.g., reduce the possibility of and/or prevent the oxidation of the upper electrode 26. The protective member 50 may directly contacted the upper electrode 26, e.g., directly contact an entirety of an upper side of the upper electrode that faces in a direction opposite from the substrate 110. The protective member 50 is described hereinafter.

A capping layer 70 may be made of, e.g., a material capable of being used as the emission layer and/or the auxiliary layer and prevent the inflow of ultraviolet (UV) generated from the outside or during the process into the light emitting member. The capping layer 70 may be omitted if required.

The thin film encapsulating layer 200 may include a plurality of layers. The thin film encapsulating layer 200 is described with reference to FIG. 3.

Figure 3:
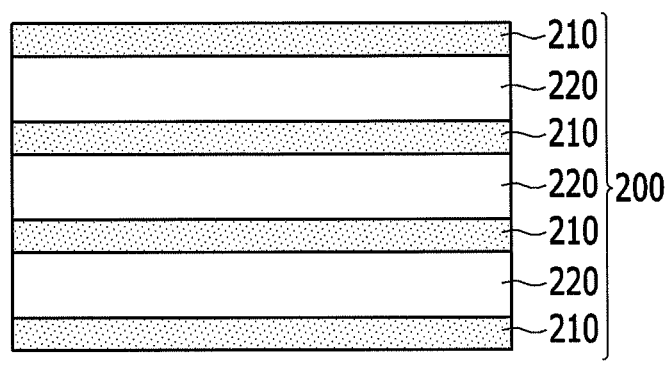
FIG. 3 is an enlarged view showing a thin film encapsulating layer in the organic light emitting diode device of FIG. 2, and FIGS. 4 to 7 are schematic views showing various shapes of a protective member in the organic light emitting diode device of FIG. 1.

FIG. 3 is an enlarged view showing a thin film encapsulating layer in the organic light emitting diode device of FIG. 2.

Referring to FIG. 3, the thin film encapsulating layer 200 may include an inorganic layer 210 and an organic layer 220, and may have a structure in which the inorganic layer 210 and the organic layer 220 are alternately and repeatedly stacked. The drawing shows the structure in which four inorganic material layers 210 and three organic layer 220 are alternately repeatedly stacked, but is not limited thereto.

The inorganic layer 210 may include at least one of, e.g., a metal such as aluminum and a metal oxide such as aluminum oxide. The organic layer 220 may include, e.g., a polymer such as an acrylate-based resin, an epoxy resin, a silicone resin, or a photo-curable compound. The inorganic layer 210 may have a thickness of, e.g., about 500 Å to about 10,000 Å, and the organic layer 220 may have a thickness of about 1 μm to about 10 μm.

The thin film encapsulating layer 200 may be easily bent since having flexible properties and have a thin thickness, thus may be applied for a thin organic light emitting diode device.

Hereinafter, the protective member 50 is detailed described.

The protective member 50 may include a metal and/or a semi-metal. The protective member 50 may include a material having a larger absolute value of standard oxidation potential than that of the material for an upper electrode 26. The standard oxidation potential is a numeral value evaluating how and/or degree of which a material is oxidized, e.g., measuring an ability to loss electrons, under the standard condition, which is at 25° C. under 1 atm. The negative value indicates that the oxidation is spontaneous, and if the absolute value is higher, the oxidation is more performed.

When the protective member 50 including a material having a larger absolute value of standard oxidation potential than that of the upper electrode 26 is formed on the upper electrode 26, the upper electrode 26 may be protected from the oxidation due to heat, light, and/or plasma exposed during a process of forming the thin film encapsulating layer 200.

For example, the thin film encapsulating layer 200 has a structure in which the inorganic layer 210 and the organic layer 220 are alternatively stacked as described in above. When the inorganic layer 210 is provided on the organic layer 220 according to a method, e.g., sputtering or plasma enhanced chemical vapor deposition (PECVD), the organic layer 220 is exposed to high energy particle or ultraviolet (UV) produced from plasma to produce the by-products including carbon, hydrogen, oxygen or the like, and the by-product may be diffused to the lower part. When the protective member 50 is contacted with the upper electrode 26, the protective member 50 is selectively earlier oxidized by the potential difference between the protective member 50 and the upper electrode 26, so the possibility of oxidation of upper electrode 26 may be reduced and/or prevented.

When the upper electrode 26 includes magnesium (Mg) or magnesium alloy as described in above, the protective member 50 may be selected from materials having a larger absolute value of standard oxidation potential than that of magnesium (Mg). Such a material may include, e.g., lithium (Li), cesium (Cs), rubidium (Rb), potassium (K), barium (Ba), strontium (Sr), europium (Eu), radium (Ra), sodium (Na), lanthanum (La), or a combination thereof, but is not limited thereto.

Table 1 shows the standard oxidation potential of the materials.

TABLE 1

| | Standard oxidation potential (V) |
|---|---|
| Lithium (Li) | −3.040 |
| Cesium (Cs) | −3.026 |
| Rubidium (Rb) | −2.98 |
| Potassium (K) | −2.931 |
| Barium (Ba) | −2.912 |
| Strontium (Sr) | −2.899 |
| Europium (Eu) | −2.812 |
| Radium (Ra) | −2.8 |
| Sodium (Na) | −2.71 |
| Lanthanum (La) | −2.379 |
| Magnesium (Mg) | −2.372 |

Considering the processibility and toxicity or the like, e.g., lithium (Li), strontium (Sr), europium (Eu), or a combination thereof may be selected among them.

The protective member 50 may have a thickness of about 50 Å to about 1,000 Å. When having the thickness within the range, the oxidation of upper electrode 26 may be prevented, and the transmittance thereof may be also ensured.

The protective member 50 may be applied in the various shapes.

FIGS. 4 to 7 are schematic views showing various shapes of a protective member in the organic light emitting diode device of FIG. 1.

Figure 4:
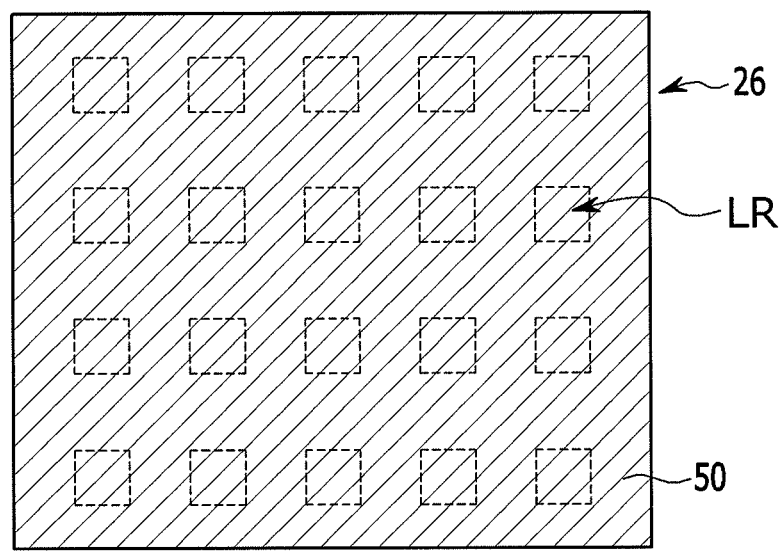
Figure 5:
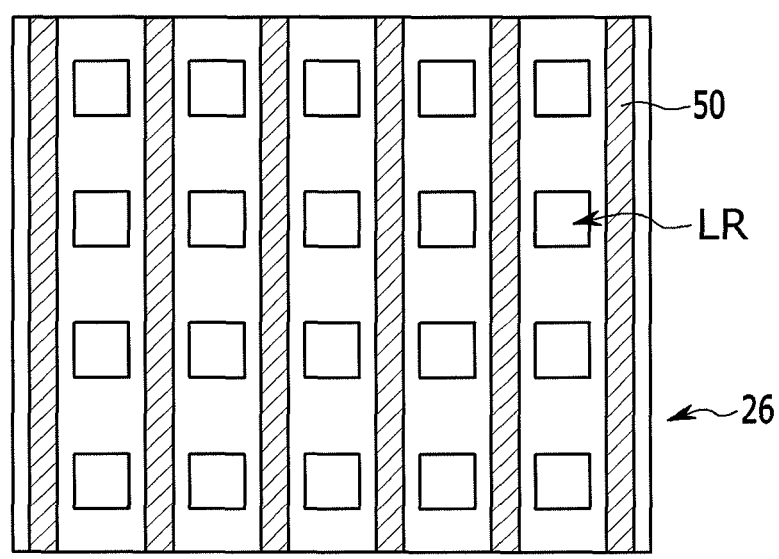
Figure 6:
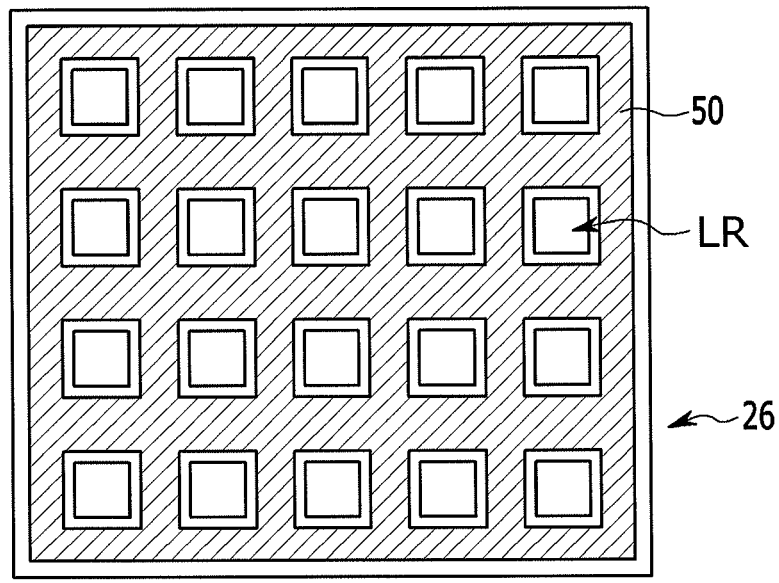
Figure 7:
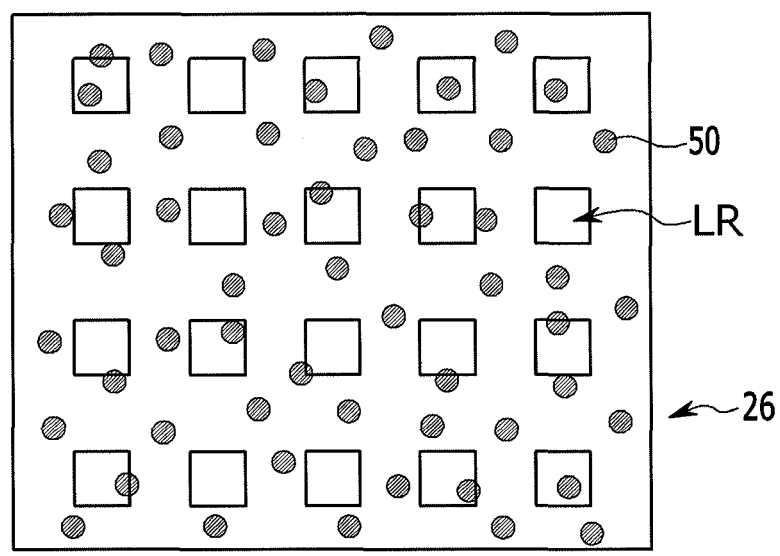

The protective member 50 may be formed in a shape of a thin film covering the entire surface of upper electrode 26 as shown in FIG. 4 or may be formed in a pattern covering at least a part of regions excepting a light emitting region (LR) where a lower electrode 22, a light emitting member 24, and an upper electrode 26 are overlapped as shown in FIG. 5 and FIG. 6, As shown in FIG. 7, the protective member 50 may be distributed in a shape of particles.

Hereinafter, a method of manufacturing the organic light emitting diode device according to one embodiment is described with reference to FIG. 2 and FIG. 3.

The manufacturing method according to one embodiment includes forming a plurality of signal line (not shown), a switching transistor (not shown) and a driving transistor (not shown) on a substrate 110, forming a lower electrode 22, forming a light emitting member 24 on the lower electrode 22, forming an upper electrode 26 on the light emitting member 24, forming a protective member 50 on the upper electrode 26, forming a capping layer 70 on the protective member 50, and forming a thin film encapsulating layer 200 on the capping layer 70.

The forming a thin film encapsulating layer 200 may include sequentially providing an inorganic layer 210 and an organic layer 220. For example, the inorganic layer 210 and the organic layer 220 may be alternatively and repeatedly stacked. The inorganic layer 210 may be formed by, e.g., sputtering or chemical vapor depositing (CVD). The inorganic layer 210 may include, e.g., a metal or a metal oxide. The organic layer 220 may be formed with a polymer by a solution process such as spin coating or inkjet.

The protective member 50 may be formed as a thin film with a material having a larger absolute value of standard oxidation potential than that of upper electrode 26 on the entire surface of upper electrode 26 according to, e.g., a thermal evaporation.

Alternatively, the protective member 50 may be formed by providing a material having a larger absolute value of standard oxidation potential than that of upper electrode 26 on at least a part of regions except the light emitting region (LR). In this case, the protective member 50 may be formed using a mask having opening or by patterning the same according to photolithography or the like after providing the same on the entire surface of upper electrode 26.

Also, the protective member 50 may be formed by providing particles including a material having a larger absolute number of standard oxidation potential than that of upper electrode 26 on one surface of upper electrode 26. In this case, the particles may be provided on the upper electrode 26 by a method such as spraying.

By way of summation and review, an organic light emitting diode device may include two electrodes and an emission layer disposed therebetween. The emission layer emits light when electrons injected from one of the electrodes are combined with holes injected from the other of the electrodes. Thus, forming excitons and releasing energy.

The organic light emitting diode device may include an encapsulating material for reducing the possibility of and/or preventing the inflow of oxygen and moisture from an outside. The encapsulating material may include, e.g., a glass plate or a metal sheet, which is fragile with respect to outside impact and has a limits for application to a flexible organic light emitting diode device.

A thin film encapsulating material in which an organic material and/or inorganic material is formed in a shape of a thin film has been suggested. However, the thin film encapsulating material may deteriorate the display characteristics since an electrode may be oxidized by the by-products produced from the thin film encapsulating material during the process.

Embodiments relate to an organic light emitting diode device and a method of manufacturing the same in which the possibility of deteriorated display characteristics is reduced and/or prevented.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode device, comprising:
a first electrode,
a light emitting member on the first electrode,
a second electrode on the light emitting member, the second electrode including a first material,
a protective member on the second electrode, the protective member including a second material having a larger absolute value of a standard oxidation potential than that of the first material, wherein the second material is disposed over and contacts the second electrode, wherein the second material includes strontium (Sr), europium (Eu), or a combination thereof, and
a thin film encapsulating layer on the protective member, wherein the protective member is disposed in the shape of the thin film covering the entire surface of the second electrode or covering at least part of the regions of the second electrode, except a light emitting region.

2. The organic light emitting diode device of claim 1, wherein the thin film encapsulating layer includes an inorganic layer and an organic material layer.

3. The organic light emitting diode device of claim 1, wherein the thin film encapsulating layer includes at least one inorganic layer and at least one organic layer that are alternately stacked.

4. The organic light emitting diode device of claim 2, wherein:
the inorganic layer includes at least one of a metal and metal oxide, and
the organic layer includes a polymer.

5. The organic light emitting diode device of claim 1, wherein:
the first material includes magnesium (Mg) or a magnesium alloy, and
the second material further includes cesium (Cs), rubidium (Rb), potassium (K), barium (Ba), radium (Ra), sodium (Na), lanthanum (La), or a combination thereof.

6. The organic light emitting diode device of claim 1, wherein the protective member is in contact with the second electrode.

7. The organic light emitting diode device of claim 1, wherein the protective member has a thickness of about 50 Å to about 1,000 Å.

8. The organic light emitting diode device of claim 1, wherein the protective member consists essentially of the second material and covers an entirety of a surface of the second electrode.

9. An organic light emitting diode device, comprising:
a first electrode,
a light emitting member on the first electrode,
a second electrode on the light emitting member, the second electrode including a first material,
a protective member on the second electrode, the protective member including a second material having a larger absolute value of a standard oxidation potential than that of the first material, wherein the second material is disposed over and contacts the second electrode, wherein the second material includes strontium (Sr), europium (Eu), or a combination thereof, and
a thin film encapsulating layer on the protective member, wherein the protective member consists essentially of the second material and is formed on regions except for a light emitting region.

10. The organic light emitting diode device of claim 1, wherein the protective member is distributed on the second electrode in a form of a particle.

11. The organic light emitting diode device of claim 1, further comprising a capping layer between the protective member and the thin film encapsulating layer.

12. A method of manufacturing an organic light emitting diode device, comprising:
   forming a first electrode,
   forming a light emitting member on the first electrode,
   forming a second electrode including a first material on the light emitting member,
   forming a protective member including a second material on the second electrode, the second material being disposed over and contacts the second electrode, the second material having a larger absolute value of a standard oxidation potential than that of the first material, the second material including strontium (Sr), europium (Eu), or a combination thereof, and
   forming a thin film encapsulating layer on the protective member,
   wherein the protective member is disposed in the shape of the thin film covering the entire surface of the second electrode or covering at least part of the regions of the second electrode, except a light emitting region.

13. The method of claim 12, wherein forming the thin film encapsulating layer includes forming an inorganic layer and an organic layer alternately.

14. The method of claim 13, wherein the inorganic layer is formed by a sputtering process or a chemical vapor deposition process.

15. The method of claim 12, wherein:
   the first material includes magnesium (Mg) or a magnesium alloy, and
   the second material further includes cesium (Cs), rubidium (Rb), potassium (K), barium (Ba), radium (Ra), sodium (Na), lanthanum (La), or a combination thereof.

16. The method of claim 12, wherein forming the protective member includes forming the second material by thermal evaporation on an entirety of a surface of the second electrode.

17. The method of claim 12, wherein forming the protective member includes forming the second material on regions except for a light emitting region.

18. The method of claim 12, wherein forming the protective member includes providing particles including the second material on one side of the second electrode.

19. The method of claim 12, further comprising forming a capping layer after forming the protective member and before forming the thin film encapsulating layer.

* * * * *